United States Patent
James et al.

(10) Patent No.: US 10,950,777 B2
(45) Date of Patent: Mar. 16, 2021

(54) CONVERSION OF HEAT TO ELECTRICITY USING PHASE TRANSFORMATIONS IN FERROELECTRIC OXIDE CAPACITORS

(71) Applicant: Regents of the University of Minnesota, Minneapolis, MN (US)

(72) Inventors: Richard D. James, Minneapolis, MN (US); Bharat Jalan, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 252 days.

(21) Appl. No.: 15/996,196

(22) Filed: Jun. 1, 2018

(65) Prior Publication Data

US 2018/0351071 A1    Dec. 6, 2018

Related U.S. Application Data

(60) Provisional application No. 62/514,154, filed on Jun. 2, 2017.

(51) Int. Cl.
*H01L 37/02* (2006.01)
*H01G 4/008* (2006.01)
(Continued)

(52) U.S. Cl.
CPC .............. *H01L 37/02* (2013.01); *H01G 4/008* (2013.01); *H01G 4/018* (2013.01); *H01G 4/40* (2013.01);
(Continued)

(58) Field of Classification Search
CPC ......... H01G 7/04; H01L 37/02; H01L 37/025; H02N 11/02; H02N 11/002; H02N 3/00; F25B 21/00; F25B 2321/001
(Continued)

(56) References Cited

U.S. PATENT DOCUMENTS 3,147,390 A * 9/1964 Beam ...................... H01L 37/02
310/306
3,234,413 A * 2/1966 Schwartz ................ H01L 37/02
310/328

(Continued)

OTHER PUBLICATIONS

Arezoomandan et al., "Large nanoscale electronic conductivity in complex oxide heterostructures with ultra high electron density" *APL Mater.*, 4:076107, 2016, 9 pages.

(Continued)

*Primary Examiner* — Burton S Mullins
(74) *Attorney, Agent, or Firm* — Fish & Richardson P.C.

(57) ABSTRACT

An example power generation system includes two capacitors and an electric load. A first capacitor includes a dielectric material that is configured to transition from a ferroelectric phase to a paraelectric or antiferroelectric phase when heated above a first transition temperature, and to transition from the paraelectric or antiferroelectric phase to the ferroelectric phase when cooled below a second transition temperature. A second capacitor is electrically coupled in parallel to the first capacitor. The electric load is electrically coupled to the first capacitor and the second capacitor. The system is configured to cyclically cool the dielectric material below the second transition temperature to draw a charge from the second capacitor to the first capacitors through the electric load, and heat the dielectric material beyond the first transition temperature to draw a charge from the first capacitor to the second capacitors through the electric load.

12 Claims, 2 Drawing Sheets

(51) Int. Cl.
  H01L 35/30   (2006.01)
  H01L 35/14   (2006.01)
  H01G 7/04    (2006.01)
  H01G 4/40    (2006.01)
  H01G 4/018   (2006.01)
  F28D 7/16    (2006.01)
(52) U.S. Cl.
  CPC .............. *H01G 7/04* (2013.01); *H01L 35/14* (2013.01); *H01L 35/30* (2013.01); *B60Y 2400/206* (2013.01); *F28D 7/16* (2013.01)
(58) Field of Classification Search
  USPC ................................................ 310/300, 306
  See application file for complete search history.

(56) References Cited

U.S. PATENT DOCUMENTS

| | | | | |
|---|---|---|---|---|
| 3,243,687 A * | 3/1966 | Siegfried | ................ | H01L 37/02 322/2 R |
| 3,278,769 A * | 10/1966 | Graham | ................ | H01G 7/026 310/306 |
| 4,220,906 A * | 9/1980 | Drummond | ............. | H01L 37/02 310/300 |
| 4,425,540 A * | 1/1984 | Olsen | ...................... | H01L 37/02 310/306 |
| 4,647,836 A * | 3/1987 | Olsen | ...................... | H01L 37/02 310/308 |
| 5,644,184 A * | 7/1997 | Kucherov | ................ | F25B 21/00 310/306 |
| 6,725,668 B1 * | 4/2004 | Cornwall | ................ | F25B 21/00 310/306 |
| 7,807,917 B2 * | 10/2010 | Atanackovic | ........... | H01L 35/22 136/205 |
| 7,982,360 B2 | 7/2011 | Erbil et al. | | |
| 8,325,463 B2 * | 12/2012 | Peterson | .............. | H02N 11/002 320/166 |
| 8,848,336 B2 * | 9/2014 | Koutsaroff | ........... | C01G 23/006 361/306.1 |
| 9,166,139 B2 * | 10/2015 | Erbil | ....................... | H01L 37/02 |
| 9,791,181 B2 * | 10/2017 | Defay | ...................... | F25B 21/00 |
| 2011/0001390 A1 | 1/2011 | Erbil et al. | | |
| 2015/0102702 A1 * | 4/2015 | Jeney | ....................... | H01L 37/02 310/306 |
| 2016/0104831 A1 * | 4/2016 | Xu | ........................... | H01L 37/02 136/201 |

OTHER PUBLICATIONS

Banerjee et al., "A spectral scheme for Kohn-Sham density functional theory of clusters," *J Computational Physics.*, 287:226-253, Apr. 15, 2015.

Barthelmie and Pryor., "Potential contribution of wind energy to climate change mitigation," *Nature Climate Change.*, 4(8):684-688, 2014.

Bhattacharya and James., "The material is the machine," *Science.*, 307:53-54, Jan. 7, 2005.

Bhatti et al., "Small-angle neutron scattering study of magnetic ordering and inhomogeneity across the martensitic phase transformation in Ni50—xCoxMn40Sn10 alloys," *Phys Rev B.*, 85(13):134450, Apr. 27, 2012, 14 pages.

Bowen et al., "Piezoelectric and ferroelectric materials and structures for energy harvesting applications," *Energy Environ Sci.*, 7:25-44, 2014.

Chambers et al., "Band alignment at epitaxial BaSnO3/SrTiO3(001) and BaSnO3/LaAlO3(001) heterojunctions" *Appl Phys Lett.*, 108:152104, 2016, 5 pages.

Chen et al., "Determination of the stretch tensor for structural transformations," *J Mechanics and Physics of Solids.*, 93:34-43, Aug. 2016.

Chen et al., "In-situ characterization of highly reversible phase transformation by synchrotron X-ray Laue microdiffraction," *Appl Phys Lett.*, 108:211902, 2016, 6 pages.

Chen et al., "Study of the cofactor conditions: Conditions of supercompatibility between phases," *J Mech Phys Solids.*, 61(12):2566-2587, 2013.

Chen et al., "Determination of the stretch tensor for structural transformations," *J Mech Phys Solids.*, Jan. 21, 2015, 12 pages.

Chluba et al., "Ultralow-fatigue shape memory alloy films," *Science.*, 348(6238):1004-1007, May 29, 2015.

Choi et al., "Enhancement of Ferroelectricity in Strained BaTiO3 Thin Films," *Science.*, 306:1005-1009, Nov. 5, 2004.

Cui et al., "Combinatorial search of thermoelastic shape-memory alloys with extremely small hysteresis width," *Nat Mater.*, 5(4):286-290, 2006.

Dawber et al., "Physics of thin-film ferroelectric oxides," *Rev Mod Phys.*, 77(4):1083-1130, Oct. 2005.

Delville et al., "Transmission electron microscopy study of phase compatibility in low hysteresis shape memory alloys," *Phil Mag.*, 90:177-195, 2010.

Eere.energy.gov' [Online], "Waste Heat Recovery: Technology and Opportunities in US Industry," Mar. 2008, [retrieved Jun. 28, 2017], retrieved from: URL<https://www1.eere.energy.gov/manufacturing/intensiveprocesses/pdfs/waste_heat_recovely.pdf>, 112 pages.

Faran and Shilo, "Twin Motion Faster Than the Speed of Sound," *Phys Rev Lett.*, 104(15):155501, Apr. 16, 2010.

Friesecke et al., "A hierarchy of plate models derived from nonlinear elasticity by Γ-convergence," *Arch Rational Mech Anal.*, 180(2):183-236, 2006.

Friesecke et al., "A theorem on geometric rigidity and the derivation of nonlinear plate theory from three dimensional elasticity," *Comm Pure and Appl Math.*, 55:1461-1506, 2002.

Ganguly et al., "Mobility-Electron Density Relation Probed via Controlled Oxygen Vacancy Doping in Epitaxial BaSnO3," *APL Mater.*, 5:056102, 2017, 7 pages.

Ganguly et al., "Structure and transport in high pressure oxygen sputter-deposited BaSnO3-δ" *APL Materials*, 3:062509, 2015.

Gu et al., "Phase Engineering and Supercompatibility of shape memory alloys" *Materials Today.*, 2017, 13 pages.

Gueltig et al., "High Frequency Thermal Energy Harvesting Using Magnetic Shape Memory Films," *Adv Energy Mater.*, 4(17):1400751, 2014.

Gueltig et al., "Thermomagnetic Actuation by Low Hysteresis Metamagnetic Ni—Co—Mn—In Films," *Materials Today: Proceedings.*, 2(3): S883-S886, 2015.

Jalan and James., "Multiferroic Energy Conversion in the Small ΔT Regime," Workshop on lower grade waste heat recovery., Dec. 13-14, 2016, 35 pages.

Jalan et al., "Enhancing the electron mobility in SrTiO3 with strain," *Appl Phys Lett.*, 98(13):132102, 2011, 3 pages.

James and Wuttig, "Magnetostriction of martensite," *Phil Mag A.*, 77(5):1273-1299, 1998.

James et al., "A Way to Search for Multiferroic Materials with "Unlikely" Combinations of Physical Properties," *Magnetism and Structure in Functional Materials. Springer Series in Mater Sci.*, 79:159, 2005, 15 pages.

James, "Magnetic alloys break the rules," *Nature.*, 521(7552):298-299, May 21, 2015.

James, "Materials from mathematics," *SIAM News.*, pp. 12-15, Nov. 3, 2014.

James, "Objective structures," *J Mech Phys Solids.*, 54:2354-2390, 2006.

James, "Taming the temperamental metal transformation," *Science.*, 348(6238):968-969, May 29, 2015.

Janotti et al., "Effects of doping on the lattice parameter of SrTiO3" *Appl Phys Lett.*, 100(26):262104, 2012, 4 pages.

Jeong et al., "A New Line Defect in NdTiO3 Perovskite", *Nano Lett.*, 16(11):6816-6822, 2016.

Jeong et al., "Observation of electrically-inactive interstitials in Nb-doped SrTiO3", *ACS Nano.*, 7(5):4487-4494, 2013.

Keeble et al., "Suppression of vacancy defects in epitaxial La-doped SrTiO3 films" *Appl Phys Lett.*, 99:232905, 2011.

(56) References Cited

OTHER PUBLICATIONS

Kohl., "Magnetic Shape Memory Microactuators," *Micromachines.*, 5(4):1135-1160, 2014.

Lee et al., "Pyroelectric energy conversion using PLZT ceramics and the ferroelectric-ergodic relaxor phase transition," *Smart Mater Struct.*, 22:025038, 2013, 16 pages.

Livescience.com' [online], Zgorski . L., "New materials turn heat into electricity," Oct. 28, 2011, [retrieved Jun. 27, 2018], retrieved from: URL<https://www.livescience.com/16790-magnetic-metals-heat-electricity-nsf-bts.html>, 4 pages.

Martin et al., "Multiferroics and magnetoelectrics: thin films and nanostructures," *J Phys: Cond Matter.*, 20(43):434220, 2008, 13 pages.

Mikheev et al., "Electric field-tunable BaxSr1—xTiO3 films with high figures of merit grown by molecular beam epitaxy," *Appl Phys Lett.*, 101(25):252906, 2012.

Moya et al., "Giant Electrocaloric Strength in Single-Crystal BaTiO3," *Adv Mater.*, 25(9):1360-1365, Mar. 6, 2013.

Ni et al., "Exceptional resilience of small-cale Au30Cu25Zn45 under cyclic stress-induced transformation" *Nano Lett.*, 16:7621-7625, 2016.

Peng et al., "Asymmetric effects of daytime and night-time warming on Northern Hemisphere vegetation," *Nature.*, 501(7465)88-92, Sep. 5, 2013.

Prakash et al., "Adsorption-controlled growth and the influence of stoichiometry on electronic transport in hybrid molecular beam epitaxy-grown BaSnO3 film†," *J Mater Chem C.*, 5:5730-5736, 2017.

Prakash et al., "Wide bandgap BaSnO3 films with room temperature conductivity exceeding 104 S cm-1," *Nat Comm.*, 8:15167, 2017, 9 pages.

Prakash et al., "Hybrid molecular beam epitaxy for the growth of stoichiometric BaSnO3", *J Vac Sci Technol A.*, 33(6):060608, Nov./Dec. 2015.

Rattner et al., "Energy harvesting, reuse and upgrade to reduce primary energy usage in the USA," *Energy.*, 36(10):6172-6183, Oct. 2011.

Satterthwaite and Ure, "Electrical and thermal properties of Bi2 Te3," *Phys Rev.*, 108(5):1164-1170, Dec. 1, 1957.

Science360.gov' [online video], "The most galaxy ever measured," Jun. 23, 2011, [retrieved Jun. 27, 2018], retrieved from: URL<https://news.science360.gov/archives/20110623/>, 2 pages.

Son et al., "Epitaxial SrTiO3 films with electron mobilities exceeding 30,000 cm2 V(-1) s(-1).," *Nat Mater.*, 9(6):482-484, Jun. 2010.

Song et al., "Enhanced reversibility and unusual microstructure of a phase-transforming material," *Nature.*, 502:85-88, Oct. 3, 2013.

Song et al., "Thermodynamics of energy conversion via first order phase transformation in low hysteresis magnetic materials ," *Energy Env Sci.*, 6(4):1315-1327, 2013.

Song et al., "Thermodynamics and energy conversion in Heusler Alloys," *Mater Sci.*, 222:269-291, Springer, 2016.

Srivastava et al., "Hysteresis and unusual magnetic properties in the singular Heusler alloy Ni45Co5Mn40Sn10," *Appl Phys Lett.*, 97:014101, 2010.

Srivastava et al., "The direct conversion of heat to electricity using multiferroic alloys," *Adv Energy Mater.*, 1:97-104, 2011.

Wang et al, "Critical thickness and strain relaxation in molecular beam epitaxy-grown SrTiO3 films," *Appl Phys Lett.*, 103:212904, 2013, 4 pages.

Wang et al., "Chemistry, growth kinetics, and epitaxial stabilization of Sn2+ in Sn-doped SrTiO3 using (CH3)6Sn2 tin precursor", *APL Mater.*, 4:126111, 2016, 7 pages.

Wang et al., "Defect-driven Localization Crossovers in MBE-Grown La-doped SrSnO3 films," *Phys Rev Mater.*, 1:061601, 2017, 6 pages.

Wang et al., "Molecular Beam Epitaxy Growth of SnO2 using a Tin Chemical Precursor", *J Vac Sci Technol A.*, 33:020606, 2015, 5 pages.

Xu et al., "Stoichiometry-driven Metalto-Insulator Transition in NdTiO3/SrTiO3 Heterostructures," *Appl Phys Lett.*, 104(8):082109, 2014, 6 pages.

Xu et al., "Predictive control over charge density in the two-dimensional electron gas at the polar/non-polar NdTiO3/SrTiO3 interface", *Phys Rev Lett.*, 117:106803, 2016, 6 pages.

Xu et al., "Quasi 2D ultra-high carrier density in a complex oxide broken-gap heterojunction," *Adv Mater Interfaces.*, 3:1500432, 2016, 8 pages.

Yuan et al., "Magnetically nanostructured state in a Ni—Mn—Sn shape-memory alloy," *Phys Rev B.*, 91:214421, 2015.

Zarnetta et al., "Identification of Quaternary Shape Memory Alloys with Near-Zero Thermal Hysteresis and Unprecedented Functional Stability," *Adv Funct Mater.*, 20(12):1917-1923, Jun. 22, 2010.

Zhang et al., "Energy barriers and hysteresis in martensitic phase transformations," *Acta Mater.*, 57(15):4332-4352, Sep. 2009.

* cited by examiner

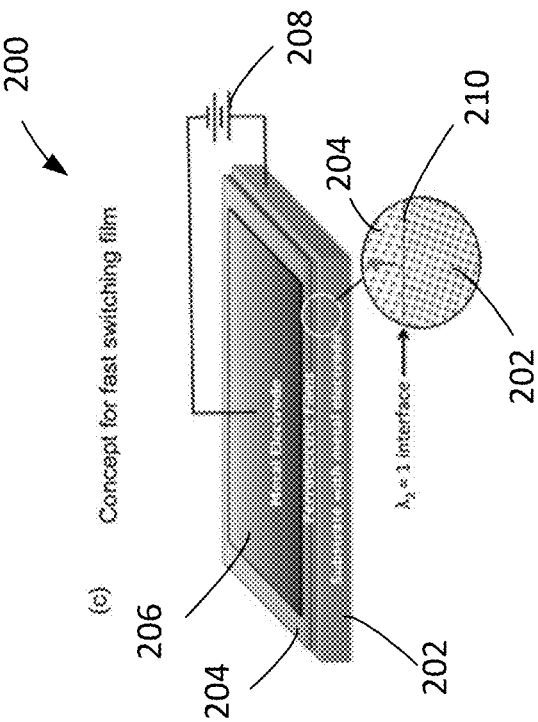
FIG. 2C
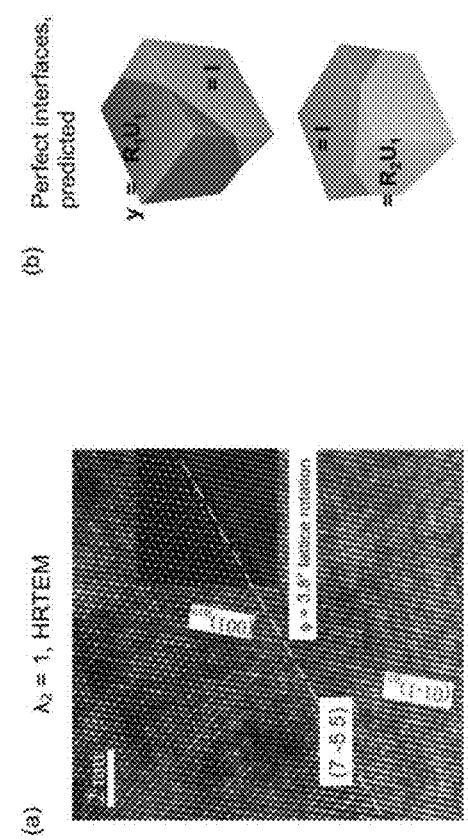
FIG. 2B
FIG. 2A

US 10,950,777 B2

CONVERSION OF HEAT TO ELECTRICITY USING PHASE TRANSFORMATIONS IN FERROELECTRIC OXIDE CAPACITORS

CROSS-REFERENCE TO RELATED APPLICATIONS

This application claims priority to U.S. Application Ser. No. 62/514,154, filed Jun. 2, 2017.

STATEMENT REGARDING FEDERALLY SPONSORED RESEARCH OR DEVELOPMENT

This invention was made with government support under FA9550-12-1-0458 awarded by Air Force Office of Scientific Research, DMR-1410888 awarded by National Science Foundation, DMR-1741801 awarded by the National Science Foundation, DMR-1629026 awarded by the National Science Foundation. The government has certain rights in the invention.

TECHNICAL FIELD

This disclosure relates to the conversion of heat (e.g., natural heat or waste heat) into electricity through the use of ferroelectric oxides.

BACKGROUND

During an industrial process, energy is often lost in the form of waste heat. To improve the efficiency of the industrial process, waste heat can be converted into electricity.

SUMMARY

In general, in an aspect, a power generation system includes a first capacitor, a second capacitor, and an electric load. The first capacitor includes a dielectric material. The dielectric material is configured to transition from a ferroelectric phase to a paraelectric or antiferroelectric phase when heated above a first transition temperature. The dielectric material is also configured to transition from the paraelectric or antiferroelectric phase to the ferroelectric phase when cooled below a second transition temperature. The second capacitor is electrically coupled in parallel to the first capacitor. The electric load is electrically coupled to the first capacitor and the second capacitor. The power generation system is configured, during operation, to cyclically cool the dielectric material below the second transition temperature, such that a charge is drawn from the second capacitor to the first capacitors through the electric load, and heat the dielectric material beyond the first transition temperature, such that a charge is drawn from the first capacitor to the second capacitors through the electric load.

Implementations of this aspect can include one or more of the following features. For example, in some implementations, the dielectric material can have a thickness of 1 μm or less.

In some implementations, the power generation system can be configured, during operation, to cyclically cool the dielectric material below the second transition temperature and heat the dielectric material beyond the first transition temperature at a frequency of 0.1 Hz or greater.

In some implementations, the power generation system can be configured, during operation, to cyclically cool the dielectric material below the second transition temperature and heat the dielectric material beyond the first transition temperature at a frequency between 0.1 Hz to 200 Hz.

In some implementations, the dielectric material can include a compound that includes tin.

In some implementations, the power generation system can further include a switch configured to selectively apply heat from a heat source to the first capacitor.

In some implementations, the heat source can be an electronic device.

In some implementations, the heat source can be a heat exhaust associated with an industrial process.

In some implementations, the heat source can be an engine.

In some implementations, the power generation system can further include a motorized mechanism configured to selectively move the first capacitor into and out a heated zone.

The details of one or more embodiments are set forth in the accompanying drawings and the description below. Other features and advantages will be apparent from the description and drawings, and from the claims.

DESCRIPTION OF DRAWINGS

FIG. 2A is a high resolution transmission electron micrograph of a perfect interface (dashed) between phases in a material ($Ti_{0.50}Ni_{0.4025}Pd_{0.0925}$) tuned to satisfy precisely $\lambda_2=1$ FIG. 2B shows a theoretical prediction corresponding to the material shown in FIG. 2A, having excellent agreement with the measurements shown in FIG. 2A.

FIG. 2C shows an example configuration that enables fast switching in which a nearly defect-free perfect interface is arranged to be parallel to the substrate of film and therefore only has to travel the thickness of the film.

Like reference symbols in the various drawings indicate like elements.

DETAILED DESCRIPTION

Figure 1:
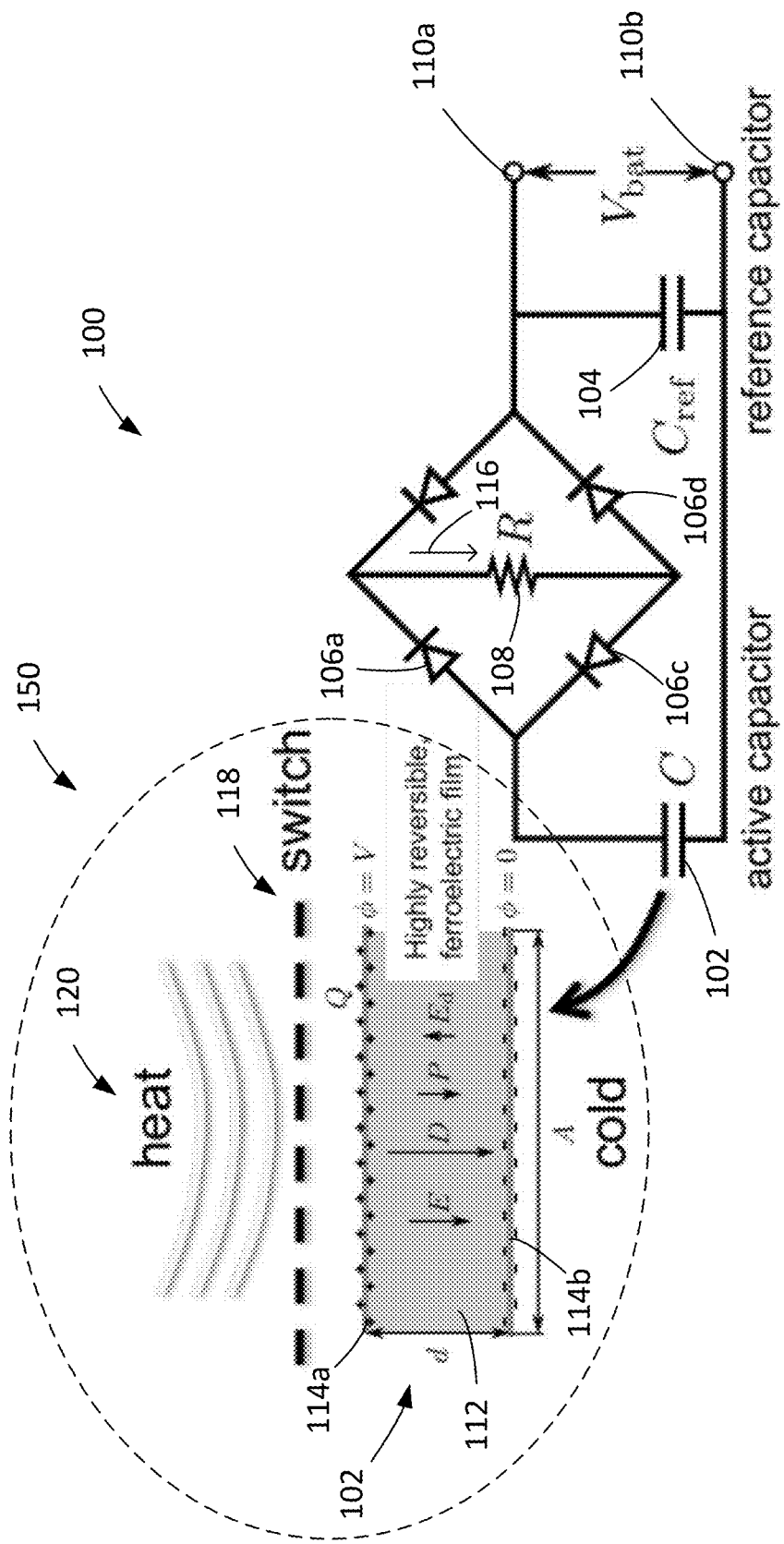
FIG. 1 is a schematic diagram of an example power generation system.

An example power generation system 100 is shown schematically in FIG. 1. Implementations of the power generation system 100 can be used to convert heat (e.g., waste heat from industrial and/or mechanical processes, waste heat from electronic devices such as mobile devices and computers (e.g., individual devices and/or multiple devices such as computer data centers), waste heat from air conditioners, or other sources of heat) into electricity.

The power generation system 100 includes an active capacitor 102, a reference capacitor 104, diodes 106a-d, and an electric load 108 (represented by a resistor). The power system 100 also includes terminals 110a and 110b.

As shown in inset 150, the active capacitor 102 includes a dielectric material 112 positioned between two electrically conductive plates 114a and 114b. Although an example arrangement of the dielectric material 112 and the electrically conductive plates 114a and 114b are shown in FIG. 1, this is merely an illustrative example and is not necessarily drawn to scale. In practice, the dimensions of the dielectric material 112 and/or the electrically conductive plates 114a and 114b can vary, depending on the implementation. As an example, in some cases, the dielectric material 112 can be a "thin film" (e.g., having a thickness of 1 μm or less).

The dielectric material 112 is composed, at least in part, of one or more ferroelectric oxides. Accordingly, the dielectric material 112 can reversibly transition between a ferroelectric phase (e.g., exhibiting strong polarization) and a paraelectric or antiferroelectric phase (e.g., exhibiting weak polarization) in response to its temperature. As an example, when the dielectric material 112 is heated above a first transition temperature, the dielectric material 112 transitions from a ferroelectric phase to a paraelectric or antiferroelectric phase. Conversely, when the dielectric material 112 is cooled below a second transition temperature, the dielectric material transitions from a paraelectric or antiferroelectric phase to a ferroelectric phase. In practice, the transition temperatures can vary, depending on the material used. In some cases, the first transition temperature and the second transition temperature can be the same or substantially the same. In some cases, the first transition temperature and the second transition temperature can be different. In some cases, the first and second transition temperatures can be either above or below room temperature. Room temperature can be, for example, between 15° C. and 25° C.

As shown in FIG. 1, the reference capacitor 104 is electrically coupled in parallel to the active capacitor 102, with the electric load 108 electrically coupled between the reference capacitor 104 and the active capacitor 102. Electric current through the electric load 108 is regulated by a diode bridge (e.g., the diodes 106a-d), such that electrical current substantially flows from the electric load 108 in a single direction (e.g., in the direction of arrow 116). The electric load 108 can be, for example, a device that consumes electrical power and/or a device that stores electrical power. Thus, electrical current passing through the electric load 108 can be used to drive an electrical device and/or stored for future use.

During operation of the power generation system 100, the dielectric material 112 is cyclically heated and cooled, such that it cyclically transitions between a ferroelectric phase and a paraelectric or antiferroelectric phase. In turn, electrical charge is cyclically exchanged between the active capacitor 102 and the reference capacitor 104 (e.g., "sloshed" between the two capacitors), resulting in an electric current through the electric load 108.

As an example, the dielectric material 112 can be heated beyond the first transition temperature, such that dielectric material 112 transitions from a ferroelectric phase to a paraelectric or antiferroelectric phase. Upon transition, a charge is drawn from the active capacitor 102 to the reference capacitor 104, resulting in an electric current through the electric load 108.

Further, the dielectric material 112 can be cooled below the second transition temperature, such that dielectric material 112 transitions from a ferroelectric phase back to a paraelectric or antiferroelectric phase. Upon transition, a charge is drawn from the reference capacitor 104 to the active capacitor 102, resulting in an electric current through the electric load 108.

Heating and cooling can be repeated cyclically to repeatedly induce an electric current through the electric load 108.

In some cases, heating and/or cooling can be provided by a switch. For instance, as shown in FIG. 1, a switch 118 can be positioned between a heat source 120 and the active capacitor 102, and selectively apply heat to from the heat source 120 to the active capacitor 102. For example, in a first state (e.g., a "closed" state), the switch 118 can thermally decouple the heat source 120 from the active capacitor 102, such that the active capacitor 102 is held at a relatively lower temperature (e.g., below the second transition temperature). In a second state (e.g., an "open" state), the switch 118 can thermally couple the heat source 120 to the active capacitor 102, such that the active capacitor 102 is heated to a relatively higher temperature (e.g., above the first transition temperature). The switch 118 can be cyclically operated to repeatedly heat and cool the active capacitor 102, resulting in cyclical electric current through the electric load 108. Example switches include mechanical switches (e.g., shutters) and electromagnetic switches (e.g., infrared shutters). In some cases, the active capacitor 102 can be rotated in and out of a heated zone (e.g., by a motorized mechanism). The heat can be radiant heat.

The frequency of heating and cooling can vary, depending on the implementation. In some cases, the active capacitor 102 can be heated and cool at a rate of approximately 0.1 Hz or greater (e.g., 0.1 Hz or greater, 1 Hz or greater, 10 Hz or greater, 100 Hz or greater, or another rate). In some cases, the active capacitor 102 can be heated and cool at a rate between 0.1 Hz and 200 Hz (e.g., between 0.1 Hz to 200 Hz, 1 Hz to 200 Hz, 10 Hz to 200 Hz, 1 Hz to 100 Hz, 10 Hz to 100 Hz, or another range of rates). Other rates are also possible, depending on the implementation.

In some cases, the heat source 120 can be a source of waste heat (e.g., a source of heat emitted due to an industrial and/or mechanical process such as a heat exhaust, a source of heat emitted from an electronic device, a source of heat emitted from an internal combustion engine, etc.). Accordingly, implementations of the power generation system 100 enable electric power to be generated from the waste heat. In some cases, this can improve the operating efficiency of an industrial and/or mechanical operations (e.g., by mitigating energy losses during the performance of the operations), to improve the battery life of portable electronic devices (e.g., by converting at least some of the waste heat back into electrical power), to improve the efficiency of operation of a computing device (e.g., by converting at least some of the waste heat back into electrical power for use by the computing device or other devices), or to improve the efficiency of an internal combustion engine (e.g., by converting at least some of the waste heat produced by the internal combustion engine into electrical power).

In some cases, the power generation system 100 can generate electric power by harnessing relatively small fluctuations in temperature. For example, in some cases, electric power can be generated due to fluctuations in temperature between 5° C. and 250° C. Thus, implementations of the power generation system 100 can be used in a variety of different contexts (e.g., industrial operations, vehicles, portable electronic devices, solar thermal power plants, etc.). In some cases, implementations of the power generation system 100 can be used to convert heat into electricity by harnessing temperature differences in the ocean or in space. In some cases, the power generation system 100 enables the "direct" conversation of heat into electricity (e.g., without requiring a separate electrical generator).

In some cases, an electrical charge can be applied to the reference capacitor 104 before operation of the power generation system 100 and/or replenished between use of the power generation system 100. For example, as shown in FIG. 1, the power generation system 100 can include two terminals 110a and 110b on opposite ends of the reference capacitor 104. An electric potential can be applied across the reference capacitor 104 using the terminals 110a and 110b (e.g., through a battery or other voltage source).

As described above, in some cases, the dielectric material 112 can be a thin film dielectric material (e.g., having a thickness of 1 µm or less). Various techniques can be used to produce these dielectric materials.

As an example, a hybrid molecular beam epitaxy (MBE) technique can be used to synthesize dielectric materials in thin film form. The hybrid MBE approach (also known as metal organic or organometallic MBE) combines the advantages of a conventional MBE technique and a metal-organic chemical vapor deposition (MOCVD) technique. For instance, for thin film growth of Sn-alloyed (Ba,Sr)TiO$_3$, a medium temperature effusion cell can be used for Ba and Sr, a rf plasma can be used as a source for oxygen, and a highly volatile metal-organic source (e.g., hexamethylditin or tetraethyltin) can be used as a source for Sn.

In some cases, the use of highly volatile tin precursor can have various practical advantages over a solid elemental tin source. For example, benefit can include (i) no flux instability in the presence of oxygen; (ii) low synthesis temperatures (vital for integration with traditional semiconductors); (iii) no practical concerns about Sn accumulation on the effusion cell shutter as it is supplied in the gaseous form; and/or (iv) higher growth rates compared to conventional oxide MBE without tin flux instability in oxygen. Further, the use of a highly volatile Sn precursor can open up an "MBE growth window" for self-regulating stoichiometric (Ba,Sr)(Ti,Sn)O$_3$ films (e.g., a range of Ba/Sn or Sr/Ti flux ratios where only stoichiometric films form).

As described herein, the active capacitor 102 can include a thin film dielectric material 112 positioned between two electrically conductive plates 114a and 114b (e.g., two metal electrodes). The metal electrodes and the dielectric material 112 can be composed from various materials, examples of which are shown in Table 1.

TABLE 1

Example materials.

| Conductive Plates | Dielectric Materials |
|---|---|
| Pt | BaTiO$_3$ |
| Au | (Ba, Sr)(Ti, Sn)O$_3$ |
| Al | (Ba, Sr)(Ti, Zr)O$_3$ |
| Ti | (Sr, Sn)TiO$_3$ |
| Pd | Pb(Ti, Zr)O$_3$ |
| Doped-BaSnO$_3$, | |
| Doped-SrTiO$_3$ | |
| Doped SrSnO$_3$ | |
| SrIrO$_3$ | |

In some cases, to protect a dielectric film with an engineered interface with a metallic electrode, miscut substrates can be used. In some cases, the substrates can be tuned to satisfy particular theoretical predictions.

An example process for synthesizing a thin film dielectric is described below.

1. Clean a substrate wafer using acetone and isopropanol for 3 minutes.
2. Load the wafers in a MBE load lock (e.g., a small vacuum chamber where the sample is first inserted) and heat to approximately 200° C. to remove water/moisture.
3. Transfer the wafers into a buffer chamber where the wafers are further cleaned (if needed) at high temperature (e.g., approximately 900° C.) in vacuum for 1-2 hours.
4. Transfer the wafers into a main growth chamber where film synthesis takes place.
5. Heat the wafers in the main chamber to the desired temperature for film synthesis/growth (e.g., between 600° C. to 1000° C.).
6. Clean the wafers further using oxygen plasma operating at an oxygen pressure of approximately $5 \times 10^{-6}$ Torr for 20 minutes at the growth temperature.
7. Calibrate or measure the fluxes of each of the constituent elements (e.g., Ba, Sr, Ti, Sn for synthesis of (Ba,Sr)(Ti,Sn)O$_3$). For Ti, and Sn, titanium tetraisopropoxide and hexamethylditin chemical precursor can be used, respectively.
8. Once the fluxes are measured, open the shutters in front of the elemental sources to begin synthesis of film of the desired composition. For instance, to synthesize, BaTiO$_3$, Ba and Ti shutters can be opened in the presence of oxygen.
9. Synthesize films for a period of time (e.g., few minutes to several hours) to obtain desirable thickness, and then close shutters of each of the elements/gases.
10. Perform reflection high energy electron diffraction to investigate surface morphology of the film.
11. Set wafer temperature to room temperature and remove the wafers.

In some cases, BaSnO$_3$ and SrSnO$_3$ can be synthesized for used as a metal electrode of the active capacitor 102. To synthesize BaSnO$_3$ or SrSnO$_3$, a similar technique can be used as described above. However, hexamethylditin can be used for tin, which forms radicals of Sn leading to synthesis of high quality films of SrSnO$_3$ and BaSnO$_3$ in the presence of oxygen plasma and molecular oxygen.

As described herein, a power generation system can be implemented based on phase transformation in ferroelectric films. For example, the phase transformation properties of ferroelectric films can be harnessed to convert heat to electricity in situations where the heat is available at relatively small temperature difference, implying broad potential applications, and significant commercial impact.

In brief, a power generation system can utilize oxide crystals that undergo highly reversible phase transformations from a strongly ferroelectric phase to a paraelectric or antiferroelectric phase upon heating. As the crystal is cooled through the phase transformation it releases heat (e.g., latent heat), transforms to the ferroelectric phase, and develops a strong polarization. If this crystal is the dielectric of a capacitor that is connected in parallel to a reference capacitor, it will draw charge from the reference capacitor. Upon heating, the crystal absorbs heat while transforming to the non-ferroelectric phase at a higher temperature (e.g., due to the Clausius-Clapeyron relation) and simultaneously releases charge to the reference capacitor. The sloshing of this charge back and forth between the active and reference capacitor through a load resistance constitutes the direct conversion of heat to electricity. Further, high quality thin single crystalline oxide films can be synthesized to provide high capacitance and high dielectric breakdown strength. Further, the temperature of the film can be reversibly and quickly cycled or switched, which enables the efficient generation of electricity.

The use of ferroelectric materials can provide various benefits. First, techniques harnessing the properties of ferroelectric materials involve the separation of charge, rather than the creation of dipoles, which ultimately can enable large power densities and larger thermodynamic efficiency. Second, these techniques are well suited to miniaturization by avoiding the presence of relatively large biasing permanent magnets and bulky coils. Therefore, this has the potential to develop compact power sources (e.g., which can recover waste heat from computing devices). Third, the heat transfer problem strongly favors a thin film-based geometry, which is favored in the ferroelectric case but may be disfavored in the magnetic case due to demagnetization effects.

An often important aspect of the use of first-order phase transformations for energy conversion is the ability to control the hysteresis of the phase transformation, as this is a major source of energy loss. For example, hysteresis can be controlled by satisfying strong conditions of geometric compatibility between phases by systematic compositional changes. Further, various "cofactor conditions" can be satisfied to further lower hysteresis, as well as improve the reversibility of the phase transformation.

Besides the long term possibility of using these techniques to produce energy from the enormous natural reserves stored on earth at small temperature difference, these techniques can be used to convert waste heat to electricity from the industrial sector, internal combustion engines, power plants, computers and hand-held electronic devices. Further, a similar potential exists in areas of waste heat production from automobiles, power plants, air conditioners, and computers.

Further still, implementation of this technology can be used in the context of solar thermal power applications. For example, implementations of this technology enable solar thermal plants to convert heat into electricity, without the need for extensive infrastructure (e.g., towers, boilers, heat exchanges, turbines, condensers, and/or piping systems to run water or water/salt-based energy conversion systems). For instance, the infrared radiation that is typically reflected by a bank of mirrors to a black tank on the top of a tower (e.g., for steam-based energy conversion) could instead be focused to a point near the mirror where a ferroelectric material-based power generation system resides. In some cases, this can enable a modular, resident-based system of energy conversion.

Further, in some cases, a power generation system can be implemented on a chip-level via the use of thin films.

Further, several major sources of energy on earth are in a temperature range that could be accessed by the power generation systems described herein. For example, the approximately 20° C. difference between surface ocean temperatures and temperatures just below the thermocline in mid-latitude waters is in a good temperature range for the systems described herein. As another example, the temperature difference in the Arctic between ocean temperature ($\geq 0°$ C.) and ambient (approximately 40° C. to −20° C. for most of the year) also is in a good range for the systems described herein, and the overall lower temperatures can lead to increased efficiency for a given temperature difference. Further, ferroelectric transformation temperatures can be readily tuned to this range. Further still, the general family of energy conversion techniques discussed in this disclosure produce no greenhouse gases. Because these techniques are based on a cyclic process that moves heat from higher to lower temperatures, they do not contribute to global warming. For example, the techniques described herein utilize nontoxic oxide materials, and the synthesis techniques involve $CO_2$ production primarily as part of the purification of the gases used to prevent (or induce) oxidation, and the power needed for melting, processing and device construction.

As described herein, a power generation system can include an active capacitor having a ferroelectric film that is subject to a rapidly oscillating temperature that passes above and below the transformation temperature of the film. The film undergoes a highly reversible, low hysteresis ferroelectric phase transformation optimized to give a large change of capacitance.

Notably, the first-order character of the phase transformation can be harnessed to convert heat into electricity. This feature implies the existence of a mixed phase region in the temperature-entropy diagram for this process, which permits high efficiency Carnot cycles. This is the solid-state analog of the fact that steam generation is used for energy production rather than single-phase gas generators. The latter supports Carnot cycles, but these often give a comparable amount of work per cycle if the working temperature difference is exceedingly high. A significant opportunity for solid-state phase transformations is that they are adapted to the small temperature difference regime of much natural and waste heat.

The use of ferroelectric energy conversion provides various benefits. For example, there is the ease in broad classes of films of moving the heat very quickly in and out of the material, particularly in thin films (e.g., a thickness of 1 μm or less) described herein. Further, capacitance goes as 1/d, so high values of capacitance are possible as compared to the bulk, and the high quality films described herein also mitigate against dielectric breakdown.

Further, we note that while thinness of film (and therefore fast heating and cooling) is a major advantage for ferroelectric case, it may be problematic in other techniques, such as in ferromagnetic energy conversion. For instance, in the case of ferromagnetic energy conversion, the rapid change of magnetization M at the transformation is partitioned between the magnetic induction B and the magnetic field H via the dipolar relation B=H+M. However, only changes of B deliver to electrical energy via Faraday's law. In contrast, for the thin film geometry, almost all of the changes of M are converted into changes of H, rather than B (e.g., dM/dt≈−dH/dt).

In some cases, the power generation system can include an active capacitor having a highly reversible oxide film with a low hysteresis ferroelectric transformation and a suitable transformation temperature (e.g., 10° C.-100° C. above room temperature. We note that transformation temperatures are highly tunable and there exist several suitable starting points for material development by compositional changes.

Further, to achieve both a highly reversible transformation and a method of fast switching, an oxide satisfying, to high accuracy, the condition $\lambda_2=1$ can be used. When $\lambda_2 \neq 1$, a broad stressed transition layer separates the two phases. In materials that do not have an exceptionally soft modulus, this layer typically undergoes a dramatic reduction to atomic dimensions as $\lambda_2 \rightarrow 1$. This is illustrated in High Resolution Transmission Electron Microscopy (HRTEM) in FIG. 2A. The measured interface normal n∥($7\bar{5}5$) in this case also agrees well with one of the two theoretical solutions of the condition of compatibility in this case. For example, FIG. 2B shows corresponding a theoretical prediction, having excellent agreement with the measurements shown in FIG. 2A.

Further, a substrate that is lattice matched to the (typically cubic) parent phase can be miscut precisely on the $\lambda_2=1$ interface plane. In the case of FIG. 2A, the substrate would be miscut on the ($7\bar{5}5$) plane. This enables exceptional switching speeds even with accepted modest values for speeds of interfaces, because the interface needs only to traverse the thickness of the film. For example, FIG. 2C shows an example configuration 200 including a substrate 202 with a metal electrode, a ferroelectric film 204, and a metal electrode 206 in a layered stack. The configuration 200 also includes a voltage source 208 electrically coupled to the film 202 and the metal electrode 206. The configuration 200 enables fast switching in which a nearly defect-free perfect interface 210 is arranged to be parallel to the substrate 202 of film 204 and therefore only has to travel the thickness of the film.

The geometry shown in FIGS. 2A and 2C is suitable for rapid switching times in devices. For example, being a perfect interface between phases, one could assume that a $\lambda_2=1$ interface could have kinetics similar to that of a twin boundary. For example, speeds of twin boundaries have been measured to be about $\sqrt{2}C_T \approx 6000$ m/s, where $C_T$ is the shear wave speed, in $BaTiO_3$ single crystals. For an interface traversing a film of thickness 1 μm at 6000 m/s, a switching time of 6 nanoseconds achieves a fully transformed film. Fast switching directly translates into high power output for an energy conversion device.

Further, a $\lambda_2=1$ ferroelectric phase transformation can be achieved by using a hybrid MBE synthesis method. In some cases, $BaTiO_3$ offers an outstanding starting point for the tuning of lattice parameters to make $\lambda_2=1$. In particular, $BaTiO_3$ has three ferroelectric phase transformations with abrupt changes of ferroelectric properties. Based on accepted measured lattice parameters, we have calculated the value of $\lambda_2$ for all three transformations, and we obtain the values $\lambda_2=0.998$ (cubic to tetragonal), $\lambda_2=1.00416$ (tetragonal to orthorhombic), and $\lambda_2=0.9978$ (orthorhombic to trigonal). These values indicate outstanding starting points for tuning of the composition to achieve $\lambda_2=1$. Further, isovalent substitutions of Pb, Ca, Sr, Zr, Hf and Sn in $BaTiO_3$ preserve one or more of these transformations out to about 20 atom %. In some cases, substitutions of Sn and Zr can be used at the B-site, and Ca and Sr at the A-site. In some cases, these particular substitutions only have a modest effect on transformation temperature.

Another attractive aspect of the ferroelectric thin film technique is that a high volumetric energy density, $\varepsilon V^2/2d^2$, where $\varepsilon$ is the permittivity, V is the applied voltage and d is thickness of dielectric, can be achieved by using thin films. For instance, a parallel plate active capacitor with $BaTiO_3$ as a dielectric medium of thickness 200 nm and with an applied voltage of 4V, will possess an energy density of $10^6$ Joule/$m^3$.

A number of embodiments have been described. Nevertheless, it will be understood that various modifications may be made without departing from the spirit and scope of the invention. Accordingly, other embodiments are within the scope of the following claims.

What is claimed is:

1. A power generation system comprising:
    a first capacitor comprising an oxide film composed of a dielectric material,
        wherein the dielectric material is configured to transition from a ferroelectric phase to a paraelectric or antiferroelectric phase when heated above a first transition temperature, and
        wherein the dielectric material is configured to transition from the paraelectric or antiferroelectric phase to the ferroelectric phase when cooled below a second transition temperature, wherein the first transition temperature is different from the second transition temperature;
    a second capacitor electrically coupled in parallel to the first capacitor; and
    an electric load electrically coupled to the first capacitor and the second capacitor,
    wherein the power generation system is configured, during operation, to cyclically:
        cool the dielectric material below the second transition temperature, such that a charge is drawn from the second capacitor to the first capacitors through the electric load, and
        heat the dielectric material beyond the first transition temperature, such that a charge is drawn from the first capacitor to the second capacitors through the electric load.

2. The power generation system of claim 1, wherein the dielectric material has a thickness of 1 μm or less.

3. The power generation system of claim 1, wherein the power generation system is configured, during operation, to cyclically cool the dielectric material below the second transition temperature and heat the dielectric material beyond the first transition temperature at a frequency of 0.1 Hz or greater.

4. The power generation system of claim 1, wherein the power generation system is configured, during operation, to cyclically cool the dielectric material below the second transition temperature and heat the dielectric material beyond the first transition temperature at a frequency between 0.1 Hz to 200 Hz.

5. The power generation system of claim 1, wherein the dielectric material comprises a compound that includes tin.

6. The power generation system of claim 1, further comprising a switch configured to selectively apply heat from a heat source to the first capacitor.

7. The power generation system of claim 6, wherein the heat source is an electronic device.

8. The power generation system of claim 6, wherein the heat source is a heat exhaust associated with an industrial process.

9. The power generation system of claim 6, wherein the heat source is an engine.

10. The power generation system of claim 1, wherein the oxide film has a lattice parameter $\lambda_2=1$.

11. The power generation system of claim 10,
    wherein the first capacitor comprises a substrate mounted to the oxide film, and
    wherein the substrate has an edge extending along a $\lambda_2=1$ interface plane of the substrate.

12. The power generation system of claim 10,
    wherein the first capacitor comprises a substrate mounted to the oxide film, and
    wherein the substrate has an edge extending along a ($7\bar{5}5$) plane of the substrate.

* * * * *